United States Patent [19]

Kimata

[11] Patent Number: 4,998,265
[45] Date of Patent: Mar. 5, 1991

[54] METHOD OF DRIVING A CHARGE DETECTION CIRCUIT

[75] Inventor: Masafumi Kimata, Itami, Japan

[73] Assignee: Mitsubishi Denki Kabushiki Kaisha, Japan

[21] Appl. No.: 452,119

[22] Filed: Dec. 18, 1989

[30] Foreign Application Priority Data

Jan. 10, 1989 [JP] Japan .................................. 1-3263

[51] Int. Cl.⁵ ...................... G11C 19/28; H01L 29/78
[52] U.S. Cl. ......................................... 377/60; 357/24
[58] Field of Search ...................... 357/24; 377/57-63

[56] References Cited

U.S. PATENT DOCUMENTS

| 3,969,634 | 7/1976 | Su et al. | 357/24 |
| 4,230,952 | 10/1980 | Knauer | 357/24 |
| 4,377,755 | 3/1983 | Jensen | 377/63 |
| 4,646,119 | 2/1987 | Kosonocky | 357/24 |
| 4,803,709 | 2/1989 | Kimata | 377/58 |

OTHER PUBLICATIONS

*IEEE Standard Dictionary of Electrical and Electronics Terms* (3rd Edition, 1984) p. 875.
White et al., "Characterization of Surface . . . Light Levels", IEEE Journal of Solid-State Circuits, vol. SC-9, 1974, pp. 1-13.

*Primary Examiner*—Gene M. Munson
*Attorney, Agent, or Firm*—Leydig, Voit & Mayer

[57] ABSTRACT

A method of driving a charge detection circuit of floating diffusion amplifier type including, a second conductivity type diffusion region produced on a first conductivity type semiconductor substrate or layer, a voltage barrier gate electrode adjacent the diffusion region, a CCD final gate electrode adjacent the voltage barrier production gate electrode, an MOS transistor for resetting the diffusion region incorporating the diffusion region as a source electrode, a source follower circuit for receiving the voltage of the diffusion region as an input signal. When the signal charges are transferred to the voltage well below the CCD final gate electrode, only the charges exceeding a voltage barrier below the voltage barrier gate electrode are output to the diffusion region.

7 Claims, 7 Drawing Sheets

METHOD OF DRIVING A CHARGE DETECTION CIRCUIT

FIELD OF THE INVENTION

The present invention relates to a method of driving a charge detection circuit and, more particularly, to a driving method for improving the characteristics of a charge detection circuit which is used as an output circuit in a semiconductor integrated circuit.

BACKGROUND OF THE INVENTION

A charge coupled device among semiconductor integrated circuits (hereinafter referred to as "CCD"), typically includes a charge detection circuit which is called as a floating diffusion amplifier which converts a charge-voltage.

Figure 6A:
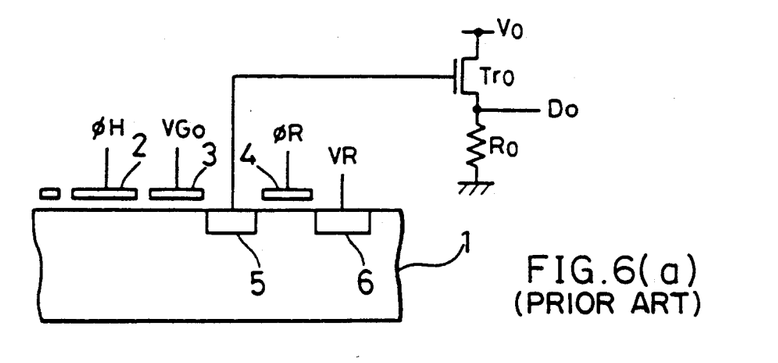
FIG. 6(a) a cross-sectional structure of a charge detection circuit according to the prior art and FIGS. 6(b)-6(d) illustrate the potentials at the respective portions of the circuit during operation.

FIG. 6(a) shows a cross-sectional structure of a floating diffusion type amplifier used as an output circuit of a CCD. In FIG. 6(a), a CCD final gate electrode 2 and a voltage barrier production gate electrode 3 are arranged opposite a first conductivity type semiconductor substrate. One of the driving clock signals for the charge transfer signal $\Phi H$ is applied to the gate electrode 2 and a DC voltage $VG_0$ is applied to the gate electrode 3. At a region adjacent to the gate electrode 3, a MOS transistor comprising a gate electrode 4 and second conductivity type high impurity concentration regions 5 and 6 is produced. To the gate electrode 4 of this MOS transistor, a reset clock signal $\Phi B$ is applied. When the reset clock $\Phi_R$ signal is high, the MOS transistor is turned on. Further, a reset power supply VR is connected to the impurity region 6.

The impurity region 5 is called a floating diffusion region, and is connected to a gate of a source follower transistor $Tr_0$ for outputting the signal which is produced on the semiconductor substrate 1. A source follower power supply $V_0$ is applied to the drain of the transistor $Tr_0$. Further, the source of the transistor $Tr_0$ is grounded through a load resistance $R_0$ and an output signal $D_0$ is output from the node at which the source and the load resistance $R_0$ are connected.

The device will operate as follows.

Figures 6B, 6C:
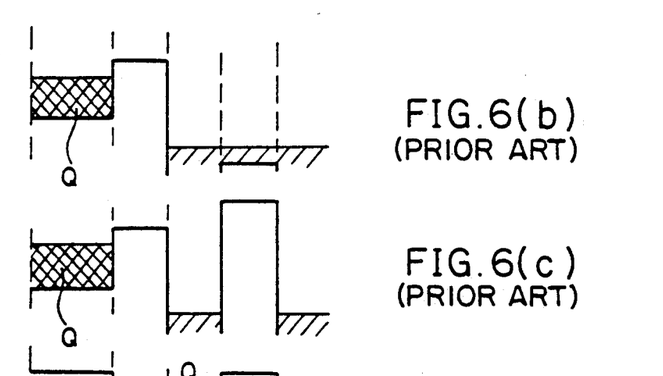
Figure 6D:
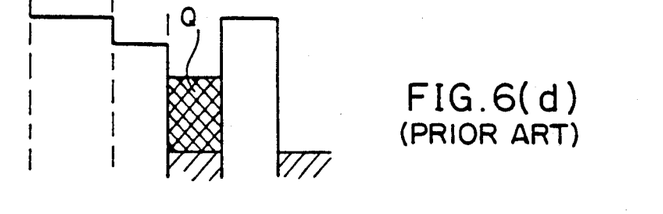
Figure 7:
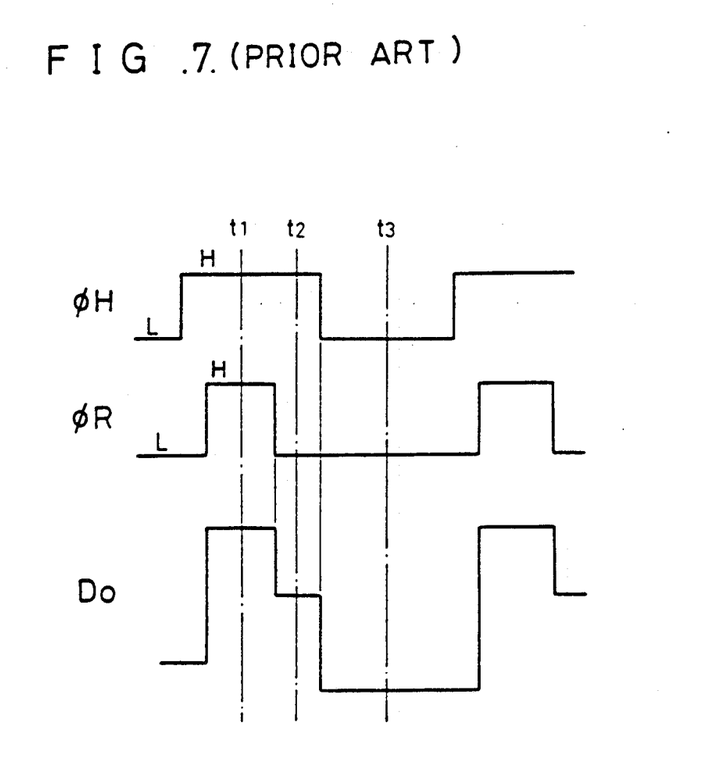
FIG. 7 is a diagram showing clock timing of a driving operation of the prior art device.

FIGS. 6(b) to 6(d) show the potentials of the respective portions of FIG. 6(a) at times corresponding to $t_1$ to $t_3$, respectively, of the clock timing chart of FIG. 7.

First of all, at time $t_1$ of FIG. 7, the driving clock signal $\Phi H$ is high, and a potential well is produced at below the gate electrode 2 as shown in FIG. 6(b), thereby storing signal charges Q. At the same time, the clock reset signal $\Phi R$ is high, and the MOS transistor including the gate electrode 4 and the impurity regions 5 and 6 is turned on, and the voltage at of the impurity region 5 and the gate of the transistor $Tr_0$ are reset to the reset power supply voltage VR.

Next, at time $T_2$ of FIG. 7, the reset clock signal $\Phi R$ becomes low, and the MOS transistor including the gate electrode 4 and the impurity region 5 is turned off (refer to FIG. 6(c)). When the reset clock signal $\Phi R$ changes to low from high, the voltage of the impurity region 5 is lowered due to the capacitive coupling of the gate electrode 4 to the impurity region 5. When the reset clock signal $\Phi R$ is low, the node connected to the impurity region 5 floats.

Next, at time $T_3$ of FIG. 7, when the driving clock signal $\Phi H$ becomes low, the signal changes Q stored at the potential well below the gate electrode 2 are read out to the impurity region 5 (refer to FIG. 6(d)), and the voltage of the node of the impurity region 5 changes. This voltage change is output through the source follower circuit. The amplitude of the output signal $\Delta V$ is represented by the following formula when the capacitance of the floating diffusion node is $C_{FD}$ and the gain of the source follower is G, $$\Delta V = \frac{G \cdot Q}{C_{FD}}. \qquad (1)$$

The gain of the source follower is usually about 0.7 to 0.9 without variations. In order to increase $\Delta V$ for a particular charge quantity Q, it is necessary to lower the capacitance $C_{FD}$. As $\Delta V$ is made larger for the same charge quantity Q, the charge-voltage conversion gain is larger, which is advantageous for the signal-to-noise ratio.

On the other hand, the maximum charge quantity which can be detected by the charge detection circuit is the charge quantity which provides a voltage change which does not exceed the channel potential below the gate electrode 3 even when the signal charges are stored at the impurity region 5. Thus the capacitance $C_{FD}$ determines the maximum quantity of charges which can be detected. When the $C_{FD}$ is reduced to increase the charge-voltage conversion gain, the voltage change of the floating diffusion portion is increased but the maximum charge quantity detected is reduced.

Figure 8:
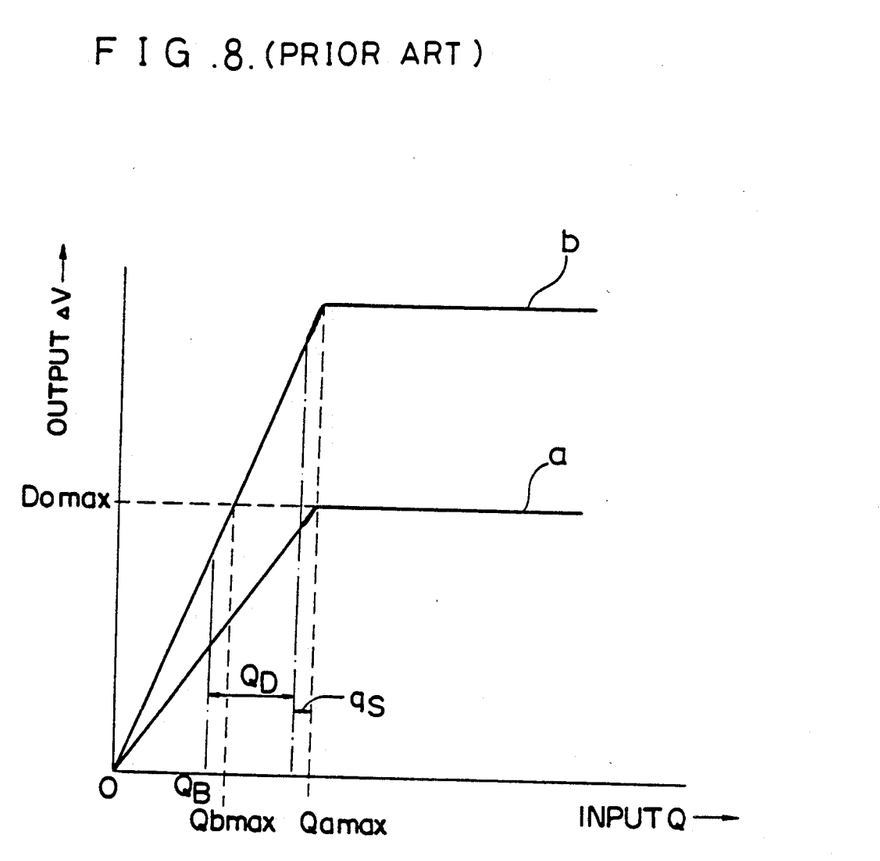
FIG. 8 is a diagram showing the relation between the signal charge quantity Q and the output voltage of the charge detection circuit.

FIG. 8 shows the relation between the quantity Q of signal charges which are electrically and optically generated by the CCD and the amplitude of the output signal of the source follower transistor, $\Delta V$. As shown in the figure, the relation between the Q and $\Delta V$ is linear up to the saturation level, $D_{0max}$, of the output which is determined by the design of CCD and the circuit of the source follower transistor. When the signal exceeds the saturation level, the output $\Delta V$ is saturated as a function of the input Q, i.e., shifted from linear characteristics. When the capacitance $C_{FD}$ is decreased and the amplitude $\Delta V$ of the output as a function of the charge quantity Q of the input is increased from a to b as shown in the figure, thereby to increase the charge-voltage conversion gain, the maximum charge quantity is reduced from $Qa_{max}$ to $Qb_{max}$. Small signal charge $q_s$, is superimposed on the background and cannot be detected.

SUMMARY OF THE INVENTION

It is an object of the present invention to provide a method of driving a charge detection circuit in which the detectable maximum charge quantity is not reduced even when the charge-voltage conversion gain is increased.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to an aspect of the present invention, a a charge detection circuit of the floating diffusion amplifier type includes a second conductivity type diffusion region on a first conductivity type semiconductor substrate, a voltage barrier gate electrode adjacent the diffusion region, a CCD final gate electrode adjacent the voltage barrier production gate electrode, a MOS transistor for resetting the diffusion region using the diffusion region as a source electrode, and a source follower circuit which receives the voltage of the diffusion region as an input and outputs and output signal. When all of the signal charges are transferred to the potential well below the CCD final gate electrode, the portion of the charges signal charges having potentials exceeding the barrier potential below the voltage barrier gate electrode are output to the diffusion region.

According to another aspect of the present invention, the charges exceeding the potential barrier below the potential barrier gate electrode output to the diffuse when signal charges are transferred to the potential well below the CCD final gate electrode is made a first output signal. After this first output signal is reset, the charges remaining below the CCD final gate electrode are output to the diffusion region portion as a second output signal.

According to a further aspect of the present invention, the voltage applied to the voltage barrier gate electrode during the signal output period in the above described two driving methods is varied in a stair step configuration.

Therefore, the charge-voltage conversion gain can be increased, and the maximum charge quantity which can be effectively detected by the charge detection circuit can be increased.

DETAILED DESCRIPTION OF THE PREFERRED EMBODIMENTS

An embodiment of the present invention will be described in detail with reference to the drawings.

Figure 1A:
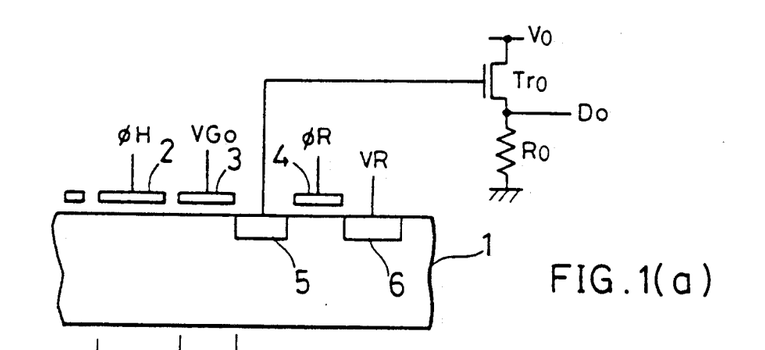
FIG. 1(a) is showing a cross-sectional structure of a charge detection circuit for a method of driving a charge detection circuit according to a first embodiment of the present invention and FIGS. 1(b)-1(d) illustrate the potentials at the respective portions of the circuit during operation.

FIG. 1(a) is a diagram showing a cross-sectional structure of a charge detection circuit which is employed on a method of driving a charge detection circuit according to a first embodiment of the present invention. This charge detection circuit has the same structure as the prior art circuit shown in FIG. 6(a).

Figures 1B, 1C:
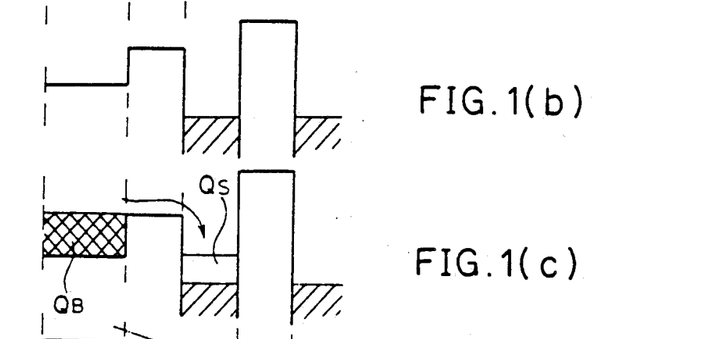
Figure 1D:
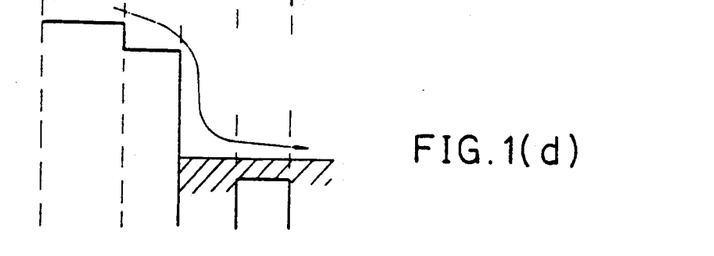
Figure 2:
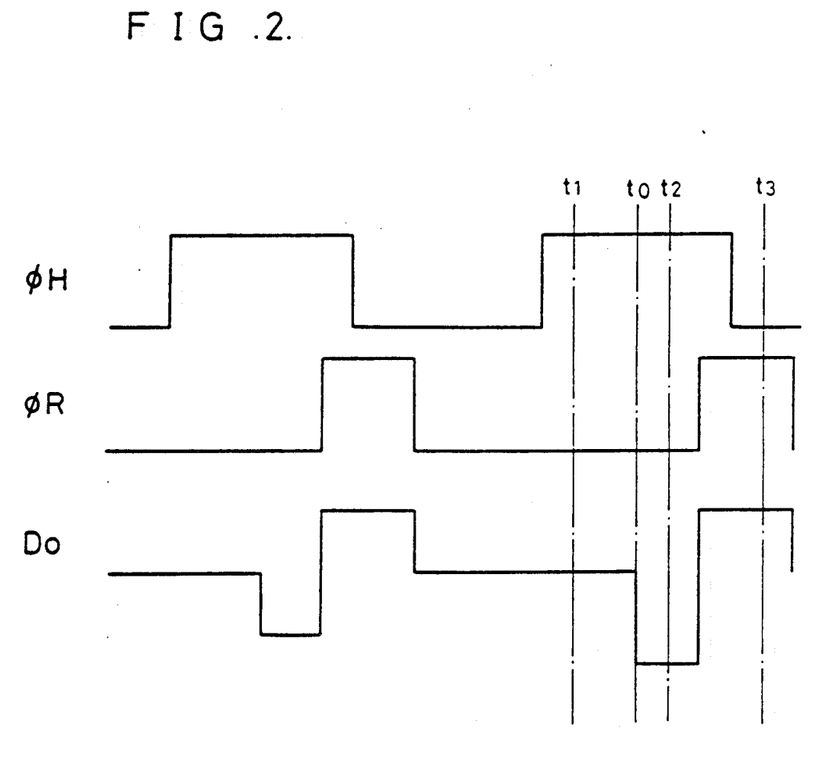
FIG. 2 is a diagram showing clock timing of a driving method according to an embodiment of the invention.

The driving method of the charge detection circuit according to the first embodiment of the present invention will be described. FIGS. 1(b) to 1(d) show the potentials of respective portions of FIG. 1(a) at times corresponding to $t_1$ to $t_3$ of the clock timing charts of FIG. 2. In FIG. 2, $t_0$ designates a time when signal charges are transferred to the potential well below the CCD final gate electrode 2.

First of all, at time $t_1$ of FIG. 2, the driving clock signal $\Phi H$ is high, and a potential well is produced below the gate electrode 2 as shown in FIG. 1(b). The floating diffusion region 5 has been reset.

Next, at time $t_2$ of FIG. 2, signal charges are transferred to the potential well below the gate electrode 2 at time $t_0$. Then, the signal charges $Q_S$ ($=Q_D+q_s$) which, with the residual signal charges $Q_B$ stored at the in the potential well below the gate electrode 2, overflow the potential barrier below the voltage barrier gate electrode 3 and are transferred to the impurity region 5, i.e., the floating diffusion region. The voltage change of the floating diffusion region due thereto is read out through the source follower circuit (refer to FIG. 1(c)).

Next, at time $t_3$ of FIG. 2, the reset clock signal $\Phi R$ is made high, the MOS transistor comprising the gate electrode 4 and the impurity regions 5 and 6, is turned on, and the driving clock signal $\Phi H$ becomes low. As a result, the signal charges $Q_B$ stored below the gate electrode 2 flow into the reset power supply VR through the channel below the gate electrode 2 and the MOS transistor, and the floating diffusion region is reset (refer to FIG. 1(d)). Accordingly, in this embodiment, the component $Q_S$, except for the background component $Q_B$, is detected from the entire charge quantity Q ($=Q_B+Q_s$).

In this embodiment, the signal charge quantity $Q_S$ ($=Q_D+q_s$) which is obtained by subtracting the background component $Q_B$ of a predetermined quantity from the signal charge quantity Q ($=Q_B+Q_D+q_s$) which has been conventionally detected is detected as discussed above. Therefore, the small signal charge quantity $q_s$ which is superimposed on the background can be reliably detected even when the charge-voltage conversion gain is increased. Further, the saturation level $D_{0max}$ of the output may be determined by circuit design to have such a value that the maximum quantity of signal charge quantity $Q_s$ can be detected, thereby increasing the detectable maximum charge quantity.

In the present invention, in order to detect the small signal charges superimposed on the background, the background component $Q_B$ of signal charge quantity Q is subtracted at the final stage by the charge detection circuit to obtain the output signal. However, it is also possible to subtract the background signal charges from the respective picture elements. In that case, however, there are fixed pattern noises for respective picture elements, thereby causing variations in the output signals. To the contrary, in the present invention, the background charge quantity subtracted can be made always constant, thereby causing no such problems.

Figure 3A:
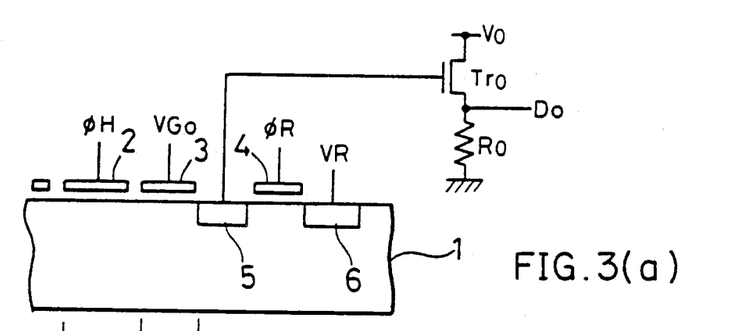
FIG. 3 is a cross-sectional structure of a charge detection circuit for a method according to an embodiment of the present invention and FIGS. 3(b)-3(g) illustrate the potentials at the respective portions of the circuit during operation.
Figures 3B, 3C:
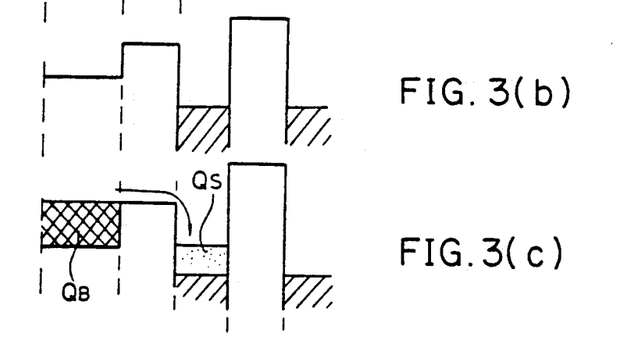
Figure 3D:
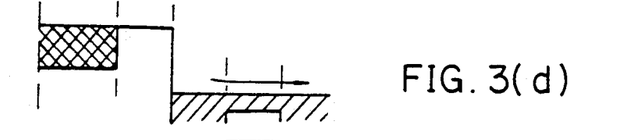
Figure 3E:
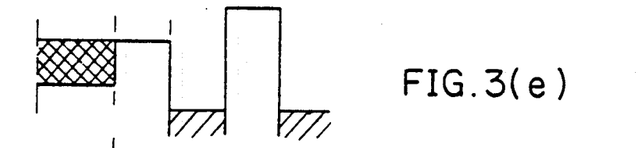
Figure 3F:
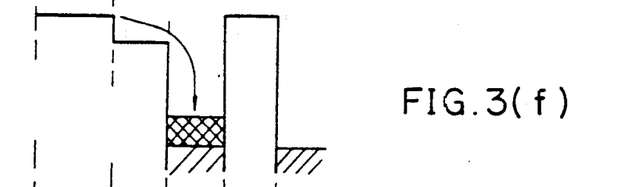
Figure 3G:
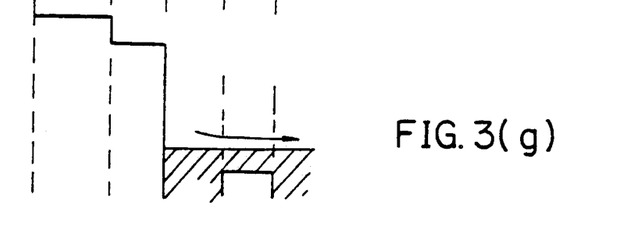
Figure 4:
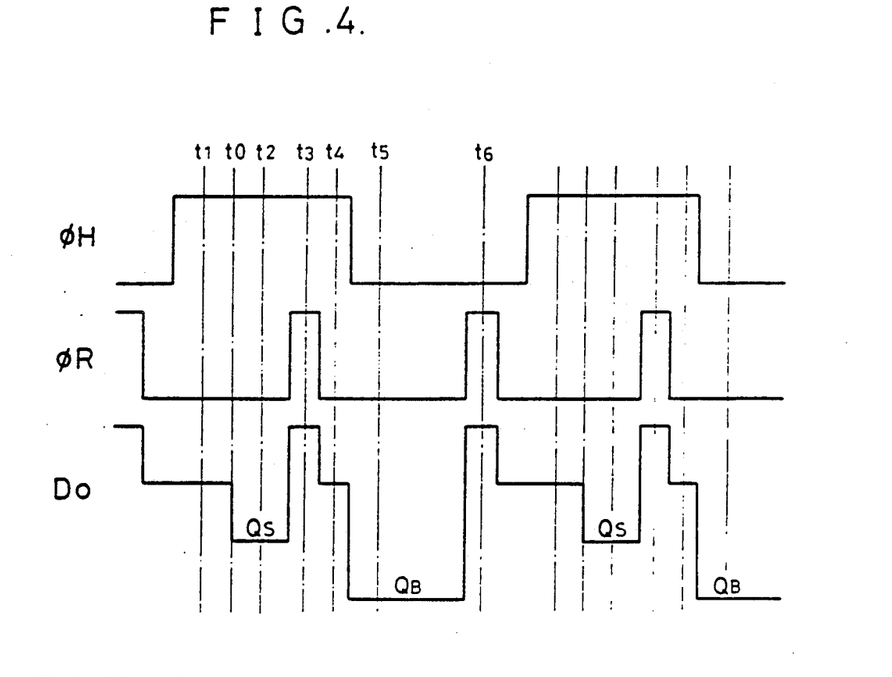
FIG. 4 is a diagram showing the clock timing of a driving method according to an embodiment of the invention.

FIGS. 3(a)-3(g) and 4 show a method of driving a charge detection circuit according to a second embodiment of the present invention. FIG. 3(a) corresponds to FIG. 1(a) of the first embodiment and FIG. 4 corresponds to FIG. 2 thereof. In FIG. 4, the operations at times corresponding to $t_1$ to $t_2$ are the same as those in the above-described first embodiment, and operations at times $t_3$ to $t_6$ will be described.

First of all, at time $t_3$ of FIG. 4, the reset clock signal $\Phi R$ is made at a high level to extract the signal charges $Q_S$ $(=Q_D+q_s)$ from the floating diffusion region 5 to the reset power supply VR as well as to reset the voltage of the floating diffusion region (FIG. 3(d)).

Next, the reset clock signal $\Phi R$ become low at time $t_4$ of FIG. 4, and the floating diffusion region floats (refer to FIG. 3(e)).

Next, at time $t_5$ of FIG. 4, the driving clock signal $\Phi H$ becomes low, and signal charges $Q_B$ stored below the gate electrode 2 and exceeding the potential barrier below the gate electrode 3 are transferred to the floating diffusion region. The voltage change of the floating diffusion portion due thereto is read out through the source follower (refer to FIG. 3(f)).

Next, at time $t_6$ of FIG. 4, the reset clock signal $\Phi R$ is again made high, and the signal charges $Q_B$ which have been stored at the floating diffusion region are transferred to the reset power supply VR and the voltage of the floating diffusion region 5 is reset (refer to FIG. 3(g)).

This second embodiment has a characteristic that the background component $Q_B$ which is included in the signal component can be also detected. Accordingly, when a delay circuit is provided outside the circuit to measure the sum of the signal component $Q_S$ and the background component $Q_B$, it can detect the entirely of charge quantity, which is quite effective when the absolute quantity of signal is required, for example where a temperature measurement is conducted utilizing infrared rays.

Figure 5:
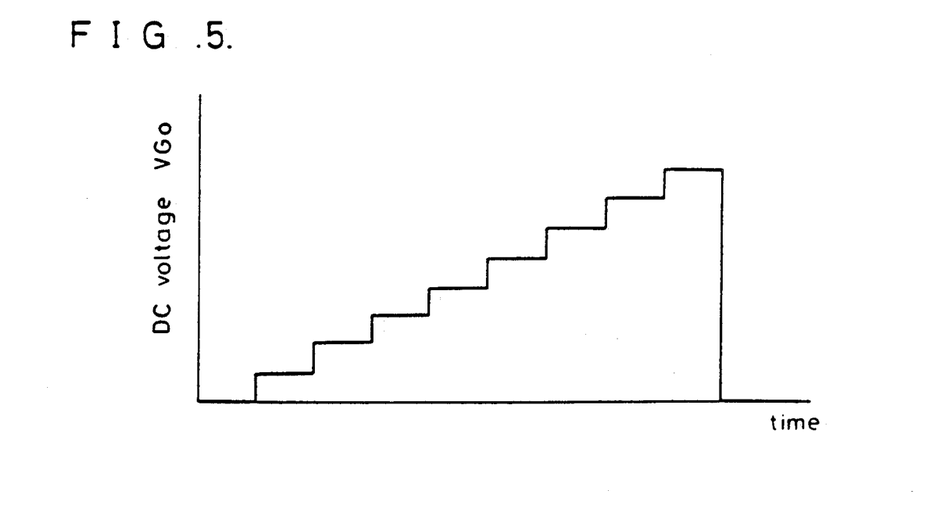
FIG. 5 is a diagram showing the waveform of the voltage applied to the gate electrode according to an embodiment of the present invention.

Furthermore, the quantity of background component $Q_B$ can be controlled by the DC voltage $VG_0$ which is applied to the gate electrode 3 in the above described first and second embodiments. However, in the third embodiment of the present invention illustrated in FIG. 5, such the voltage $VG_0$ is varied in a stair step configuration during the signal reading out periods, to extract stored signal charges from the floating diffusion region 5 to the reset power supply at each step as well as to reset the voltage of the floating diffusion portion. In this embodiment, the output signal, which is determined by the level $VG_0$, may be successively obtained. When the capacitance below the CCD final gate electrode is sufficiently large, the maximum charge quantity can be determined in accordance with the cycle time of reading out steps, and the detectable maximum charge quantity can be further increased, when the steps are numerous. This is effective in a variety of digital processing applications.

While in the above-illustrated embodiment a CCD output circuit is described, the present invention may be applied to any type of integrated circuits such as MOS type image sensors which require the conversion of electrical charges to a voltage.

While in the above-illustrated embodiment a one stage source follower circuit is provided and a resistor is employed for the load thereof, there may be provided a plurality of stages of source follower circuits and the load may comprise a transistor with the same effects as described above.

While in the above-illustrated embodiment a charge detection circuit an MOS type transistor including second conductivity type impurity regions on a first conductivity type semiconductor substrate is described, the present invention is not restricted to this structure, and it may be replaced by a first conductivity type semiconductor layer which is disposed on a second conductivity type semiconductor substrate.

Furthermore, since the present invention can be performed in a structure as similar to the prior art structure, an alternative usage of the prior art method and the present invention method can be simply conducted by external alternation of the signal driving sequence, thereby enabling operation in a plurality of modes.

Furthermore, the present invention is not be restricted to having the described timing sequences and other timing sequences which enable the abovedescribed operation may be employed.

As is evident from the foregoing description, according to the present invention, the charge quantity which can be stored below a gate electrode directly before a charge detection circuit is a charge quantity which is to be extracted as unrequired charge, and the extra signal charges which cannot be stored below the gate electrode when signal charges are transferred to below the gate electrode are detected by the charge detection circuit, and the signal which is obtained by subtracting a background component of a predetermined quantity from the signal charges is output. Therefore, the carrier-voltage conversion gain of the charge detection circuit can be increased and the detectable maximum charge quantity can be also increased.

What is claimed is:

1. A method of driving a charge detection circuit of a floating diffusion type amplifier including a second conductivity type region contacting a first conductivity type semiconductor body, a voltage barrier gate electrode disposed opposite said body and adjacent said second conductivity type region, a CCD gate electrode disposed opposite said body and adjacent said voltage barrier gate electrode, a MOS transistor for resetting said second conductivity type region and employing said second conductivity type region as a source, and a source follower circuit for receiving the voltage at said second conductivity type region as an input signal, said method comprising:

simultaneously producing a potential well in the body opposite the CCD gate electrode by applying a first signal to the CCD gate electrode and a potential barrier in the body opposite the voltage barrier electrode adjacent the potential well;

transferring electrical signal charges into the potential well; and sequentially transferring portions of the signal charges from the potential well to the second conductivity type region that exceed the potential barrier by applying a staircase signal including a plurality of discrete step changes in magnitude to the potential barrier electrode.

2. A method of driving a charge detection circuit as defined in claim 1 including outputting a portion of the signal charges from said second conductivity type region to the source follower circuit at each of the step changes of the staircase signal.

3. A method of driving a charge detection circuit as defined in claim 1 including a plurality of source follower circuits.

4. A method of driving a charge detection circuit of a floating diffusion type amplifier including a second conductivity type region contacting a first conductivity type semiconductor body, a voltage barrier gate electrode disposed opposite said body and adjacent said second conductivity type region, a CCD gate electrode disposed opposite said body and adjacent said voltage barrier gate electrode, a MOS transistor for resetting said second conductivity type region and employing said second conductivity type region as a source, a source follower circuit for receiving the voltage at said second conductivity type region as an input signal, said method comprising:

- simultaneously producing a potential well in the body opposite the CCD gate electrode by applying a first signal to the CCD gate electrode and a potential barrier in the body opposite the voltage barrier electrode adjacent the potential well by applying a second signal to the voltage barrier electrode;
- transferring electrical signal charges into the potential well;
- transferring the portion of the signal charges from the potential well to the second conductivity type region that exceed the potential barrier as a first output signal;
- resetting the second conductivity type region by turning on the MOS transistor to extract residual electrical signal charges from the second conductivity type region; and
- after resetting, removing the voltage barrier opposite the voltage barrier electrode by applying a third signal to the voltage barrier electrode and transferring the remaining electrical signal charges from the potential well to the second conductivity type region as a second output signal.

5. A method of driving a charge detection circuit as defined in claim 5 including sequentially transferring portions of the signal charges from the potential well to the second conductivity type region by applying a staircase signal including a plurality of discrete step changes in magnitude to the potential barrier electrode.

6. A method of driving a charge detection circuit as defined in claim 6 including outputting charges from said second conductivity type region to the source follower circuit at each of the step changes of the staircase signal.

7. A method of driving a charge detection circuit as defined in claim 5 including a plurality of source follower circuits.

* * * * *

UNITED STATES PATENT AND TRADEMARK OFFICE
CERTIFICATE OF CORRECTION

PATENT NO. : 4,998,265

DATED : March 5, 1991

INVENTOR(S) : Masafumi Kimata

It is certified that error appears in the above-identified patent and that said Letters Patent is hereby corrected as shown below:

Column 8, line 10, change "5" to --4--;

Column 8, line 16, change "6" to --5--;

Column 8, line 21, change "5" to --4--.

Signed and Sealed this

Twenty-fifth Day of August, 1992

Attest:

DOUGLAS B. COMER

Attesting Officer      Acting Commissioner of Patents and Trademarks